United States Patent [19]

Osterhout et al.

[11] Patent Number: 4,876,632

[45] Date of Patent: Oct. 24, 1989

[54] FLASHLIGHT WITH BATTERY LIFE INDICATOR MODULE

[75] Inventors: Ralph F. Osterhout, San Francisco; Paul L. Howard, Belmont; Greta G. Light, San Mateo, all of Calif.

[73] Assignee: Tekna, Inc., Redwood City, Calif.

[21] Appl. No.: 155,426

[22] Filed: Feb. 12, 1988

Related U.S. Application Data

[63] Continuation-in-part of Ser. No. 147,795, Feb. 10, 1988, abandoned.

[51] Int. Cl.[4] ................................................. F21L 9/00
[52] U.S. Cl. ..................................... 362/183; 362/208; 320/48; 340/636
[58] Field of Search ............... 362/183, 204, 205, 208, 362/802; 320/48; 340/636

[56] References Cited

U.S. PATENT DOCUMENTS

| | | | |
|---|---|---|---|
| 4,575,784 | 3/1986 | Diau | 362/183 |
| 4,638,237 | 1/1987 | Fernandez | 320/48 |
| 4,800,336 | 1/1989 | Mikami et al. | 320/48 X |

Primary Examiner—Stephen F. Husar
Attorney, Agent, or Firm—Townsend and Townsend

[57] ABSTRACT

A battery life indicator module that is mounted between a flashlight head assembly containing the light reflector and a battery casing assembly for holding the batteries is disclosed. The battery life indicator module contains an indicator, such as a light-emitting diode (LED). Internal to the battery life indicator module is a circuit which measures the battery level and activates the indicator to display the battery level. The module also provides the necessary electrical connection between the batteries and the light bulb of the flashlight. In the preferred embodiment, three LEDs are used to indicate various levels of charge. The monitoring circuit is activated by the ON/OFF switch of the flashlight so that power is not drained when the flashlight is not in use. The module has threads at its two ends for coupling to the flashlight head assembly and the battery casing assembly. The monitoring circuit contains a pair of voltage dividers for providing two voltages references. These references are provided to two comparators which also monitor the voltage level on the battery. The output of the comparators are provided to two of the LEDs, while the third LED is connected to the output of a NAND gate which has inputs from each of the comparators.

22 Claims, 3 Drawing Sheets

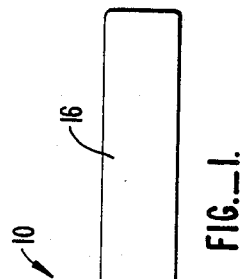
FIG._1.
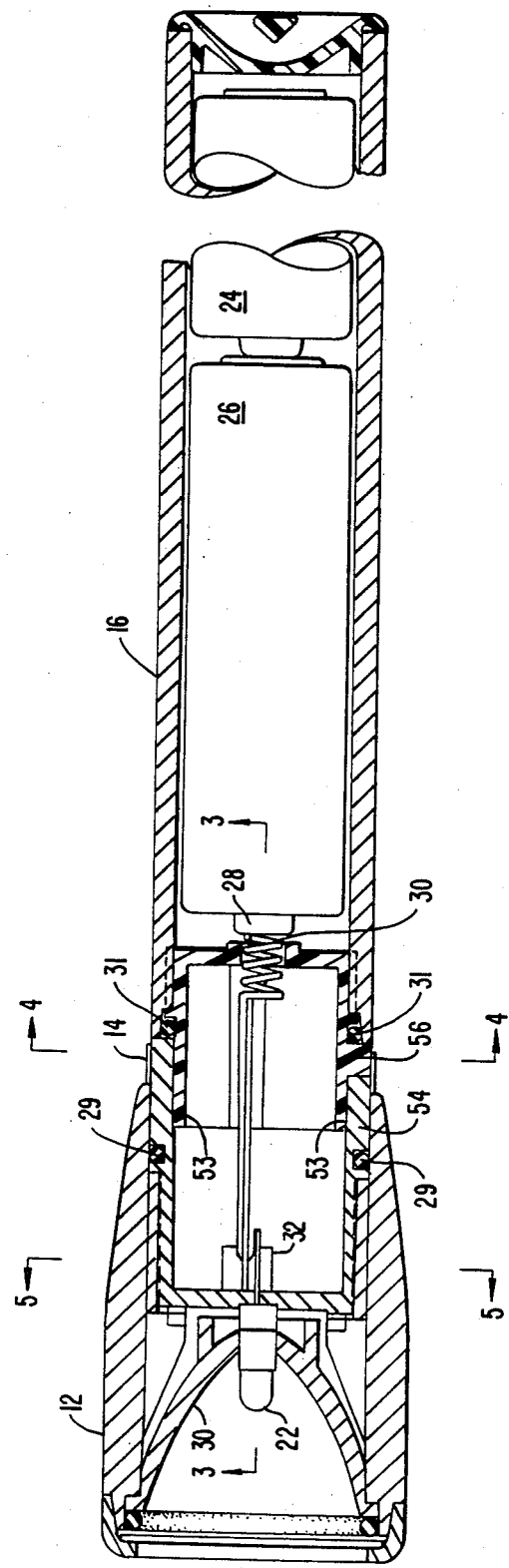
FIG._2.

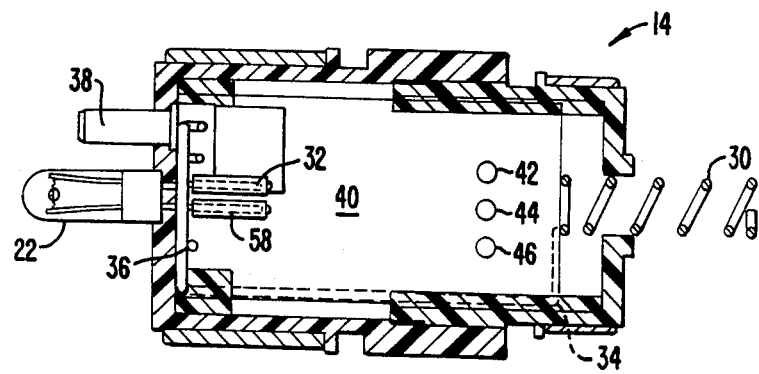
FIG._3.
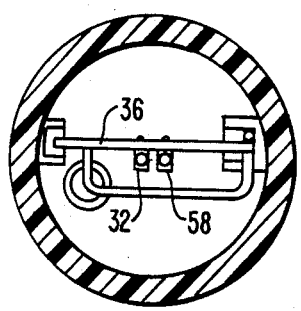
FIG._5.
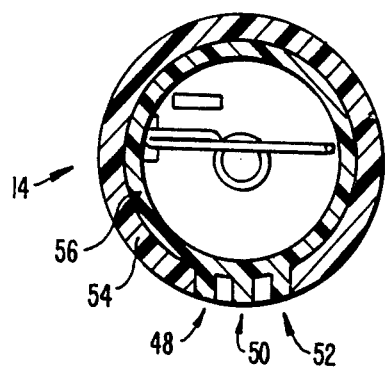
FIG._4.

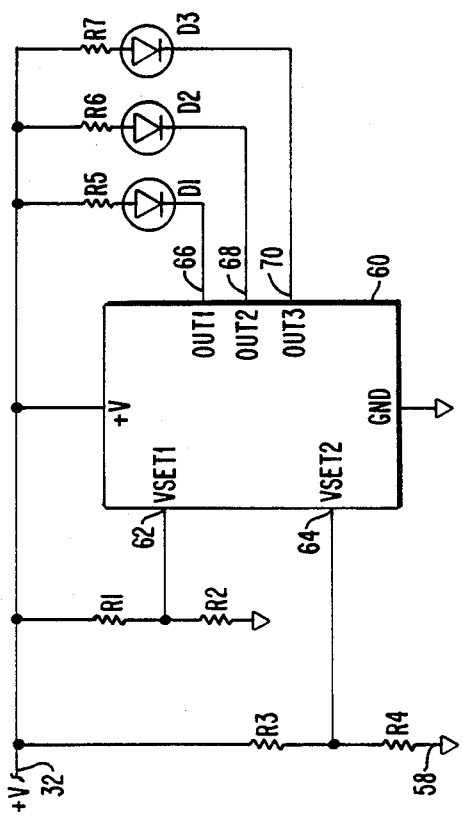
FIG._6.
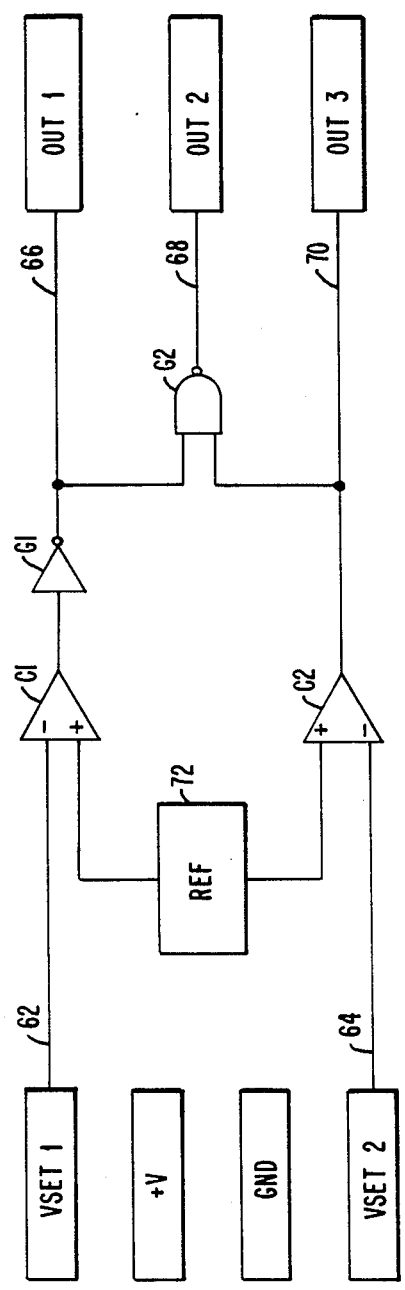
FIG._7.

FLASHLIGHT WITH BATTERY LIFE INDICATOR MODULE

This is a continuation-in-part of patent application Ser. No. 147,795 filed Feb. 10, 1988, now abandoned.

BACKGROUND OF THE INVENTION

The present invention relates to devices for indicating the level of charge on a battery, and in particular to such a device in a flashlight.

There are numerous battery charge measuring devices which measure the electrical charge on a battery by measuring the voltage or current and providing a visual indication of the charge level. Such devices typically have leads which can be coupled to the battery to be measured. Examples of such devices are shown in U.S. Pat. Nos. 3,500,372; 4,198,597; 4,365,241; 4,520,353; 4,626,765; 4,560,937; 4,536,757; and 4,316,185.

U.S. Pat. No. 4,027,231 shows a battery charge indicator and suggests in column 4, lines 3-11, that it could be permanently mounted in a radio.

SUMMARY OF THE INVENTION

The present invention is a battery life indicator module that is mounted between a flashlight head assembly containing the light reflector and a battery casing assembly for holding the batteries. The battery life indicator module contains an indicator, such as a light-emitting diode (LED). Internal to the battery life indicator module is a circuit which measures the battery level and activates the indicator to display the battery level. The module also provides the necessary electrical connection between the batteries and the light bulb of the flashlight.

In the preferred embodiment, three LEDs are used to indicate various levels of charge. The monitoring circuit is activated by the ON/OFF switch of the flashlight so that power is not drained when the flashlight is not in use. The module has threads at its two ends for coupling to the flashlight head assembly and the battery casing assembly.

The monitoring circuit contains a pair of voltage dividers for providing two voltages references. These references are provided to two comparators which also monitor the voltage level on the battery. The output of the comparators are provided to two of the LEDs, while the third LED is connected to the output of a NAND gate which has inputs from each of the comparators.

The use of a separate module for the battery life indicator makes the flashlight easy to assemble and simplifies the necessary structure. This positioning also allows the circuit to be activated by the flashlight ON/OFF switch with ease. The use of O-rings and an ultrasonic weld in the battery life indicator module keeps the flashlight waterproof.

For a fuller understanding of the nature and advantages of the invention, reference should be made to the ensuing Detailed Description taken in conjunction with the accompanying drawings.

BRIEF DESCRIPTION OF THE DRAWINGS

FIG. 1 is a diagram of a flashlight according to the present invention showing the battery life indicator module;

FIG. 2 is a sectional view of the flashlight of FIG. 1;

FIG. 3 is a sectional view of the battery life indicator module along lines 3—3 of FIG. 2;

FIG. 4 is a sectional view along lines 4—4 of FIG. 2;

FIG. 5 is a sectional view along lines 5—5 of FIG. 2;

FIG. 6 is a diagram of the battery life indicator circuit; and

FIG. 7 is a diagram of the comparator circuit of FIG. 6.

DETAILED DESCRIPTION OF THE PREFERRED EMBODIMENTS

FIG. 1 shows a flashlight 10 according to the present invention having a flashlight head module 12 a battery life indicator module 14 and a battery casing module 16. Battery life indicator 14 is provided with three windows 18 for the viewing of three internal LEDs. Module 14 has a male screw fitting on one end to screw into a female screw fitting of flashlight head module 12. A second end of module 14 has another male screw fitting for coupling inside of battery casing 16 to a female screw thread therein.

FIG. 2 shows a lengthwise sectional view of a flashlight of FIG. 1. Flashlight head assembly 12 contains a reflector 20 and has a light bulb 22 mounted therein. Battery casing 16 contains two batteries 24 and 26. A male contact 28 of battery 26 is electrically coupled to a spring 30 which is in turn electrically coupled through module 14 to a contact 32 to a lead of light bulb 22 as can be seen in more detail in the sectional view of FIG. 3. O-rings 29 and 32 provide waterproofing at the connections to head assembly 12 and battery casing 16. respectively.

FIG. 3 is a sectional view of module 14 with light bulb 22 mounted therein and spring 30 attached to the rear end thereof. An electrical connection is provided by a lead 34 (shown in phantom) to a movable bar 36. Bar 36 can be moved by a plunger 38 to come in contact with contact 32, which is coupled to light bulb 22. Plunger 38 is depressed by screwing head assembly 12 of FIG. 2 onto battery life indicator module 14.

A circuit board 40 contains circuitry coupled to contact 32 for monitoring a charge level of the batteries. Since this circuitry is coupled to contact 32, it will not be activated until plunger 38 depresses rod 36 to turn on the flashlight. The output circuit on circuit board 40 is coupled to one of three LEDs 42, 44 and 46. The three LEDs indicate different charge levels of the battery. For instance, LED 42 may be green to indicate a high charge level, LED 44 may be yellow to indicate an intermediate charge level, and LED 46 may be red to indicate a low battery charge level.

The sectional view of FIG. 4 along lines 4—4 of FIG. 2 shows three rectangular openings 48, 50 and 52 which line up with LEDs 42, 44 and 46 of FIG. 3. As can be seen from FIG. 4, battery life indicator module 14 has an external, opaque casing 54 with an internal, clear casing 56 which has three rectangular protrusions that form light-transmitting windows 48, 50 and 52. Clear casing 56 fits inside opaque casing 54 as shown in FIG. 2. Clear casing 56 has threads for connecting to battery casing 16, while opaque casing 54 has threads for coupling to head assembly 12. An ultrasonic weld 53, shown in FIG. 2, joins casings 54 and 56 together to provide waterproofing. O-rings 29 and 31 also are needed for waterproofing, with O-ring 31 providing a static seal and O-ring 29 providing a dynamic seal against head casing 12, which moves over O-ring 29 as it is adjusted. The holes accommodating electrical lead 34 at both ends of the battery life indicator module are on the inside of the O-ring and inside weld 53. Thus, water cannot get through LED windows 48, 50 and 52 or the threads.

FIG. 5 shows contact bar 36 and bulb contacts 32 and 58 in more detail.

FIG. 6 is a diagram of a battery life indicator circuit on circuit board 40 of FIG. 3. A voltage level monitor is provided on line 32 as the positive voltage. Contact 58 provides the ground reference. A comparator module 60 receives two voltages as its input on lines 62 and 64. Input 62 is provided from a voltage divider consisting of resistors R1 and R2 and input 64 is from a voltage divider consisting of resistors R3 and R4. Three outputs are provided to LEDs D1, D2 and D3, respectively on lines 66, 68 and 70. The LEDs are coupled to the positive voltage on line 32 by resistors R5, R6 and R7.

Comparator module 60 can be seen in more detail in FIG. 7. The voltage divider input 62 and 64 are provided to a pair of comparators C1 and C2. Each of these inputs are provided to a negative input of a comparator, while the positive input of each comparator is connected to a voltage reference 72 of a approximately 1.235 volts, which is provided by a voltage divider circuit from flashlight batteries 24, 26. By choosing a small, divided-down reference level, a given percentage change in the battery level is a small absolute change in voltage reference 72. The output of comparator C1 is provided through an invertor G1 to output 66 and is one input of NAND gate G2. Similarly, the output of comparator C2 is provided to output line 70 and the other input of NAND gate G2. The output of NAND gate G2 is an intermediate output line 68.

Table 1 below sets forth the voltage levels which will result in one of the diodes D1, D2 and D3 being turned on.

TABLE 1

| VEST1 | VSET2 | OUT1 | OUT2 | OUT3 | D1 | D2 | D3 |
| --- | --- | --- | --- | --- | --- | --- | --- |
| >VREF | >VREF | LOW | HIGH | HIGH | ON | OFF | OFF |
| <VREF | >VREF | HIGH | LOW | HIGH | OFF | ON | OFF |
| <VREF | <VREF | HIGH | HIGH | LOW | OFF | OFF | ON |

(Note: VSET1> VSET2)

As will be understood by those familiar with the art, the present invention may be embodied in other specific forms without departing from the spirit or central characteristics thereof. For example, more or less than three LEDs could be used, or a different configuration of the monitoring circuit could be used.

Alternately, the module could be placed on the other side of the battery casing at the end of the flashlight or between an end of the battery casing and an end cap. In this configuration, the battery indicator circuit would either have to be in series with the batteries or an electrical connection must be provided through the battery casing from the opposite end of the battery or batteries. For example, a wire could be embedded in a plastic battery housing to provide a connection from the positive end of the battery back to a battery life indicator circuit. Accordingly, the disclosure of the preferred embodiment of the invention is intended to be illustrative, but not limiting, of the scope of the invention which is set forth in the following claims.

What is claimed is:

1. An apparatus for a flashlight comprising:
   a tubular module having first and second ends;
   means for coupling said first end to a flashlight head assembly;
   means for coupling said second end to a battery holder assembly;
   means for providing an electrical connection between said battery holder assembly and said flashlight bulb assembly;
   an indicator mounted in said tubular module and visible from the exterior of said tubular module; and
   circuit means for measuring a battery level and activating said indicator when said battery level passes a predetermined value.

2. The apparatus of claim 1 further comprising means, coupled to an ON/OFF switch of said flashlight, for activating said circuit means.

3. The apparatus of claim 1 where each of said means for coupling includes a threaded connection.

4. The apparatus of claim 1 wherein said indicator comprises at least two light emitting diodes.

5. The apparatus of claim 1 further comprising:
   a circuit board for holding said circuit means;
   at least two light emitting diodes mounted on said circuit board;
   means, mounted on said circuit board, for coupling said circuit means to the leads of a flashlight bulb; and
   said tubular module defining at least a pair of windows proximate said light emitting diodes for allowing light from said light emitting diodes to escape.

6. The apparatus of claim 5 wherein said means for coupling to said flashlight bulb leads comprises:
   a movable bar proximate said flashlight bulb leads; and
   a plunger coupled to said flashlight bulb assembly for moving said movable bar into contact with one of said flashlight bulb leads when said flashlight bulb assembly is screwed onto said tubular module.

7. The apparatus of claim 1 wherein said circuit means comprises:
   first and second voltage dividers coupled to receive a battery level voltage for providing first and second voltage set values;
   first and second comparators, each having a first input coupled to a midpoint of one of said voltage dividers;
   a voltage reference coupled to a second input of each of said first and second comparators;
   an inverter coupled to an output of said comparators;
   a NAND gate having a first input coupled to an output of said inverter and a second input coupled to an output of said second comparator;
   a first light emitting diode coupled to an output of said inverter;
   a second light emitting diode coupled to an output of said NAND gate; and
   a third light emitting diode coupled to an output of said second comparator.

8. An apparatus for a flashlight comprising:
   a tubular module having first and second ends, each of said ends having threads for coupling to a flashlight head assembly and a battery holder assembly, respectively;
   means for providing an electric connection between said battery holder assembly and said flashlight head assembly;
   a circuit board mounted inside said tubular module;

at least two light emitting diodes mounted on said circuit board, said tubular module defining at east two windows proximate said light emitting diodes for allowing light to escape; and circuit means for measuring a battery level and activating said light emitting diodes responsive to said battery level.

9. The apparatus of claim 8 further comprising first and second O-rings mounted on said tubular module proximate said first and second ends.

10. The apparatus of claim 8 wherein said tubular module includes an opaque portion at one of said first and second ends and a clear portion at the other of said first and second ends, said clear portion extending inside said opaque portion to seal said windows.

11. A flashlight comprising:
a head module having an opening at a first end for emitting light;
a reflector mounted in said head module;
a light bulb mounted between said reflector and said head module opening;
a battery life indicator module having a first end coupled to a second end of said head module;
a battery casing for holding at least one battery having a first end coupled to a second end of said battery life indicator module;
an indicator mounted in said battery life indicator module; and
circuit means for measuring a parameter related to a charge of said battery and activating said indicator when said battery level passes a predetermined value.

12. The flashlight of claim 11 further comprising means, coupled to an on/off switch of said flashlight, for activating said circuit means.

13. The flashlight of claim 11 further comprising first and second threads on said first and second ends of said battery life indicator module for coupling to said head module and said battery casing, respectively.

14. The flashlight of claim 11 wherein said indicator comprises at least two light emitting diodes.

15. The flashlight of claim 11 further comprising:
a circuit board for holding said circuit means;
at least two light emitting diodes mounted on said circuit board;
means, mounted on said circuit board, for coupling said circuit means to the leads of a flashlight bulb; and
said tubular module defining at least a pair of windows proximate said light emitting diodes for allowing light from said light emitting diodes to escape.

16. The flashlight of claim 15 wherein said means for coupling to said flashlight bulb leads comprises:
a movable bar proximate said flashlight bulb leads; and
a plunger coupled to said flashlight bulb assembly for moving said movable bar into contact with one of said flashlight bulb leads when said flashlight bulb assembly is screwed onto said tubular module.

17. The flashlight of claim 11 wherein said circuit means comprises:

first and second voltage dividers coupled to receive a battery level voltage for providing first and second voltage set values;

first and second comparators, each having a first input coupled to a midpoint of one of said voltage dividers;

a voltage reference coupled to a second input of each of said first and second comparators;

an inverter coupled to an output of said comparators;

a NAND gate having a first input coupled to an output of said inverter and a second input coupled to an output of said second comparator;

a first light emitting diode coupled to an output of said inverter;

a second light emitting diode coupled to an output of said NAND gate; and a third light emitting diode coupled to an output of said second comparator.

18. A module for incorporation into a flashlight having at least one battery comprising:
an indicator mounted in said module and visible from the exterior of said module;
circuit means for measuring a battery level and activating said indicator when said battery level passes a predetermined value; and
means, coupled to an ON/OFF switch of said flashlight, for activating said circuit means.

19. The apparatus of claim 18 wherein said indicator comprises at least two light emitting diodes.

20. The apparatus of claim 18 further comprising:
a circuit board for holding said circuit means;
at least two light emitting diodes mounted on said circuit board,
means, mounted on said circuit board, for coupling said circuit means to the leads of a flashlight bulb; and
said module defining at least a pair of windows proximate said light emitting diodes for allowing light from said light emitting diodes to escape.

21. The apparatus of claim 18 wherein said circuit means comprises:
first and second voltage dividers coupled to receive a battery level voltage for providing first and second voltage set values;

first and second comparators, each having a first input coupled to a midpoint of one of said voltage dividers;

a voltage reference coupled to a second input of each of said first and second comparators;

an inverter coupled to an output of said comparators;

a NAND gate having a first input coupled to an output of said inverter and a second input coupled to an output of said second comparator;

a first light emitting diode coupled to an output of said inverter;

a second light emitting diode coupled to an output of said NAND gate; and a third light emitting diode coupled to an output of said second comparator.

22. The apparatus of claim 18 further comprising a battery casing having a wire embedded therein for connecting a positive end of said battery to said circuit means.

* * * * *